(12) United States Patent
Cheng et al.

(10) Patent No.: US 12,108,640 B2
(45) Date of Patent: Oct. 1, 2024

(54) ARRAY SUBSTRATE, DISPLAY DEVICE AND ELECTROSTATIC PROTECTION UNIT

(71) Applicants: Beijing BOE Technology Development Co., Ltd., Beijing (CN); BOE Technology Group Co., Ltd., Beijing (CN)

(72) Inventors: Hongfei Cheng, Beijing (CN); Xueguang Hao, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 430 days.

(21) Appl. No.: 17/418,810

(22) PCT Filed: Nov. 3, 2020

(86) PCT No.: PCT/CN2020/126247
§ 371 (c)(1),
(2) Date: Jun. 26, 2021

(87) PCT Pub. No.: WO2021/088824
PCT Pub. Date: May 14, 2021

(65) Prior Publication Data
US 2022/0069056 A1    Mar. 3, 2022

(30) Foreign Application Priority Data

Nov. 6, 2019    (CN) .......................... 201921905962.6

(51) Int. Cl.
*H10K 59/131* (2023.01)
*G02F 1/1362* (2006.01)
(Continued)

(52) U.S. Cl.
CPC ..... *H10K 59/131* (2023.02); *G02F 1/136204* (2013.01); *G02F 1/136286* (2013.01);
(Continued)

(58) Field of Classification Search
CPC ........................ H01L 27/0288; H01L 27/0248
See application file for complete search history.

(56) References Cited

U.S. PATENT DOCUMENTS

2009/0174975 A1    7/2009  Huang et al.
2013/0062607 A1*   3/2013  Yamazaki ........... H01L 27/0266
                                            257/E29.273
(Continued)

FOREIGN PATENT DOCUMENTS

CN    106024781 A    10/2016
CN    110061062 A     7/2019
(Continued)

*Primary Examiner* — Yu-Hsi D Sun
(74) *Attorney, Agent, or Firm* — IPro, PLLC (57) ABSTRACT

Provided is an array substrate, including: a first conductive wire, a second conductive wire and a first electrostatic protection unit, wherein the first electrostatic protection unit comprises a first thin-film transistor and a first capacitor; wherein a gate of the first thin-film transistor is suspended and is connected to a first electrode of the first thin-film transistor via the first capacitor, the first electrode of the thin-film transistor is connected to the first conductive wire, and a second electrode of the first thin-film transistor is connected to the second conductive wire.

12 Claims, 8 Drawing Sheets

(51) Int. Cl.
*G02F 1/1368* (2006.01)
*H01L 27/02* (2006.01)

(52) U.S. Cl.
CPC ........ *G02F 1/1368* (2013.01); *H01L 27/0266* (2013.01); *H01L 27/0288* (2013.01)

(56) References Cited

U.S. PATENT DOCUMENTS

2018/0358353 A1    12/2018  Gai et al.
2022/0045180 A1*    2/2022  Xiao ................. H01L 29/41733

FOREIGN PATENT DOCUMENTS

| CN | 110085584 A | 8/2019 |
| CN | 210575951 U | 5/2020 |

\* cited by examiner

ARRAY SUBSTRATE, DISPLAY DEVICE AND ELECTROSTATIC PROTECTION UNIT

This application is a US national stage of international application No. PCT/CN2020/126247, filed on Nov. 3, 2020, which claims priority to the Chinese Patent Application No. 201921905962.6, filed on Nov. 6, 2019 and entitled "ELECTROSTATIC PROTECTION UNIT AND ARRAY SUBSTRATE", the disclosures of which are herein incorporated by reference in their entireties.

TECHNICAL FIELD

The present disclosure relates to the field of display technologies, and in particular, relates to an array substrate, a display device and an electrostatic protection unit.

BACKGROUND

Nowadays, active-matrix organic light-emitting diode (AMOLED) displays and liquid crystal displays (LCDs) have extensive market applications.

SUMMARY

The present disclosure provides an array substrate, a display device and an electrostatic protection unit.

An embodiment of the present disclosure provides an array substrate. The array substrate includes a first conductive wire, a second conductive wire and a first electrostatic protection unit. The first electrostatic protection unit includes a first thin-film transistor and a first capacitor, wherein a gate of the first thin-film transistor is suspended and is connected to a first electrode of the first thin-film transistor via a first capacitor, the first electrode of the thin-film transistor is connected to the first conductive wire, and a second electrode of the first thin-film transistor is connected to the second conductive wire.

Optionally, the electrostatic protection unit further includes: a second capacitor, wherein the gate of the first thin-film transistor is connected to a second electrode of the first thin-film transistor via the second capacitor.

Optionally, the first electrostatic protection unit further includes a second thin-film transistor and a third capacitor, wherein a gate of the second thin-film transistor is suspended and is connected to a first electrode of the second thin-film transistor via the third capacitor, the first electrode of the second thin-film transistor is connected to the second electrode of the first thin-film transistor, and a second electrode of the second thin-film transistor is connected to the second conductive wire, such that the second electrode of the first thin-film transistor is connected to the second conductive wire via the second thin-film transistor.

Optionally, the first electrostatic protection unit further includes a fourth capacitor, wherein the gate of the second thin-film transistor is connected to the second electrode of the second thin-film transistor via the fourth capacitor.

Optionally, the first electrostatic protection unit further includes: a second thin-film transistor, a fourth capacitor, a fifth capacitor and a sixth capacitor, wherein the first electrode of the first thin-film transistor is connected to the second electrode of the first thin-film transistor via the sixth capacitor;
the second electrode of the first thin-film transistor is connected to a first electrode of the second thin-film transistor, a gate of the second thin-film transistor is suspended and is connected to a second electrode of the second thin-film transistor via the fourth capacitor, and the first electrode of the second thin-film transistor is connected to the second electrode of the second thin-film transistor via the fifth capacitor.

Optionally, the array substrate includes a substrate, and a semiconductor layer, a gate insulating layer, a gate layer, an interlayer insulating layer and a source-drain layer which are sequentially laminated on the substrate, wherein
an active layer of the first thin-film transistor is disposed in the semiconductor layer, the gate of the first thin-film transistor is disposed in the gate layer, and the first electrode and the second electrode of the first thin-film transistor are disposed in the source-drain layer; and
the first electrode of the first thin-film transistor includes a first overlap portion overlapped with the gate of the first thin-film transistor, the first overlap portion and the gate of the first thin-film transistor form the first capacitor forming the first capacitor, the first electrode of the first thin-film transistor is connected to the active layer of the first thin-film transistor via a first via hole, and the second electrode of the first thin-film transistor is connected to the active layer of the first thin-film transistor via a second via hole, the first via hole and the second via hole passing through the interlayer insulating layer and the gate insulating layer.

Optionally, the second electrode of the first thin-film transistor includes a second overlap portion overlapped with the gate of the first thin-film transistor, the second overlap portion and the gate of the first thin-film transistor forming the second capacitor.

Optionally, the array substrate includes: a substrate, and a semiconductor layer, a gate insulating layer, a gate layer, an interlayer insulating layer, and a source-drain layer which are sequentially laminated on the substrate,
wherein an active layer of the first thin-film transistor and an active layer of the second thin-film transistor are disposed in the semiconductor layer, the gate of the first thin-film transistor and the gate of the second thin-film transistor are disposed in the gate layer, and the first and second electrodes of the first thin-film transistor and the first and second electrodes of the second thin-film transistor are disposed in the source-drain layer;
the first electrode of the first thin-film transistor includes a first overlap portion overlapped with the gate of the first thin-film transistor, the first overlap portion and the gate of the first thin-film transistor forming the first capacitor, the first electrode of the first thin-film transistor is connected to the active layer of the first thin-film transistor via a first via hole, and the second electrode of the first thin-film transistor is connected to the active layer of the first thin-film transistor via a fourth via hole; and
the first electrode of the second thin-film transistor includes a third overlap portion overlapped with the gate of the second thin-film transistor, the third overlap portion and the gate of the second thin-film transistor forming the third capacitor, the first electrode of the second thin-film transistor is connected to the active layer of the second thin-film transistor via the fourth via hole, and the second electrode of the second thin-film transistor is connected to the active layer of the second thin-film transistor via a second via hole,
wherein the first via hole, the second via hole and the fourth via hole pass through the interlayer insulating layer and the gate insulating layer.

Optionally, the second electrode of the first thin-film transistor includes a second overlap portion overlapped with the gate of the first thin-film transistor, the second overlap portion and the gate of the first thin-film transistor forming the second capacitor; and/or, the second electrode of the second thin-film transistor includes a fourth overlap portion overlapped with the gate of the second thin-film transistor, the fourth overlap portion and the gate of the second thin-film transistor forming a fourth capacitor.

Optionally, the array substrate further includes: a substrate, and a semiconductor layer, a gate insulating layer, a gate layer, an interlayer insulating layer, and a source-drain layer which are sequentially laminated on the substrate, wherein an active layer of the first thin-film transistor and an active layer of the second thin-film transistor are disposed in the semiconductor layer and are of an integral structure that has a metalized area, the gate of the first thin-film transistor and the gate of the second thin-film transistor are disposed in the gate layer, the first electrode of the first thin-film transistor and the second electrode of the second thin-film transistor are disposed in the source-drain layer, and the second electrode of the first thin-film transistor and the first electrode of the second thin-film transistor are disposed in the metalized area;

the first electrode of the first thin-film transistor includes a first overlap portion overlapped with the gate of the first thin-film transistor, the first overlap portion and the gate of the first thin-film transistor forming the first capacitor, and the first electrode of the first thin-film transistor includes a sixth overlap portion overlapped with the metalized area, the sixth overlap portion and the metallized area forming a sixth capacitor, and the first electrode of the first thin-film transistor is connected to the active layer of the first thin-film transistor via a first via hole, the first via hole passing through the interlayer insulating layer and the gate insulating layer; and the second electrode of the second thin-film transistor includes a fourth overlap portion overlapped with the gate of the second thin-film transistor, the fourth overlap portion and the gate of the second thin-film transistor forming the fourth capacitor, and the second electrode of the second thin-film transistor includes a fifth overlap portion overlapped with the metallized area, the fifth overlap portion and the metallized area forming a fifth capacitor, and the second electrode of the second thin-film transistor is connected to the active layer of the second thin-film transistor via a second via hole, the second via hole passing through the interlayer insulating layer and the gate insulating layer.

Optionally, the array substrate further includes a substrate, and a semiconductor layer, a gate insulating layer, a gate layer, an interlayer insulating layer, and a source-drain layer which are sequentially laminated on the substrate, wherein an active layer of the first thin-film transistor and an active layer of the second thin-film transistor are disposed in the semiconductor layer and are of an integral structure that has a metalized area, the gate of the first thin-film transistor and the gate of the second thin-film transistor are disposed in the gate layer, the first electrode of the first thin-film transistor and the second electrode of the second thin-film transistor are disposed in the source-drain layer, and the second electrode of the first thin-film transistor and the first electrode of the second thin-film transistor are disposed in the metalized area;

the first electrode of the first thin-film transistor includes a first overlap portion overlapped with the gate of the first thin-film transistor, the first overlap portion and the gate of the first thin-film transistor forming the first capacitor, a portion of the first electrode of the first thin-film transistor is disposed in a fifth via hole that is disposed in the interlayer insulating layer at a position corresponding to the second electrode of the first thin-film transistor, wherein the portion of the first electrode of the first think-film transistor disposed in the fifth via hole includes a sixth overlap portion overlapped with the metalized area, the sixth overlap portion and the metalized area forming a sixth capacitor, and the first electrode of the first thin-film transistor is connected to the active layer of the first thin-film transistor via a first via hole, the first via hole passing through the interlayer insulating layer and the gate insulating layer; and the second electrode of the second thin-film transistor includes a fourth overlap portion overlapped with the gate of the second thin-film transistor, the fourth overlap portion and the gate of the second thin-film transistor forming the fourth capacitor, a portion of the second electrode of the second thin-film transistor is disposed in a sixth via hole that is disposed in the interlayer insulating layer at a position corresponding to the first electrode of the second thin-film transistor, wherein the portion of the second electrode of the second think-film transistor disposed in the sixth via hole includes a fifth overlap portion overlapped with the metalized area, the fifth overlap portion and the metalized area forming a fifth capacitor, and the second electrode of the second thin-film transistor is connected to the active layer of the second thin-film transistor via a second via hole, the second via hole passing through the interlayer insulating layer and the gate insulating layer.

Optionally, the semiconductor layer is made of an oxide semiconductor, and an aspect ratio of a channel of the first thin-film transistor is less than $\frac{1}{20}$ and greater than $\frac{1}{100}$.

Optionally, the first conductive wire is one of a gate wire, a data wire, and an electrostatic protection wire, and the second conductive wire is one of a gate wire, a data wire, and an electrostatic protection wire.

Optionally, the array substrate further includes: a third conductive wire, a fourth conductive wire, and a second electrostatic protection unit, wherein the second electrostatic protection unit is connected between the third conductive wire and the fourth conductive wires, and the second electrostatic protection unit is in a same structure as the first electrostatic protection unit.

Optionally, the first conductive wire is the gate wire, the second conductive wire is the first electrostatic protection wire, the third conductive wire is the data wire, the fourth conductive wire is the second electrostatic protection wire, an extension direction of the data wire is intersected with an extension direction of the gate wire, an extension direction of the first electrostatic protection wire P1 is the same as an extension direction of the data wire, and an extension direction of the second electrostatic protection wire is the same as an extension direction of the gate wire.

Optionally, the first electrostatic protection wire is connected to the second electrostatic protection wire.

Optionally, the first electrostatic protection wire and the second electrostatic protection wire are connected to a reference voltage input terminal.

An embodiment of the present disclosure further provides a display device, which includes any one of the array substrates as previously defined.

An embodiment of the present disclosure further provides an electrostatic protection unit. The electrostatic protection unit includes a first thin-film transistor and a first capacitor, wherein a gate of the first thin-film transistor is suspended and is connected to a first electrode of the first thin-film transistor via the first capacitor.

Optionally, the electrostatic protection unit further includes: a second capacitor, wherein the gate of the first thin-film transistor is connected to a second electrode of the first thin-film transistor via the second capacitor.

Optionally, the electrostatic protection unit further includes: a second thin-film transistor and a third capacitor, wherein a gate of the second thin-film transistor is suspended and is connected to a first electrode of the second thin-film transistor via the third capacitor, and the first electrode of the second thin-film transistor is connected to the second electrode of the first thin-film transistor.

Optionally, the electrostatic protection unit further includes: a fourth capacitor, wherein the gate of the second thin-film transistor is connected to the second electrode of the second thin-film transistor via the fourth capacitor.

Optionally, the electrostatic protection unit further includes: a second thin-film transistor, a fourth capacitor, a fifth capacitor, and a sixth capacitor, wherein the first electrode of the first thin-film transistor is connected to a second electrode of the first thin-film transistor via the sixth capacitor, and the second electrode of the first thin-film transistor is connected to a first electrode of the second thin-film transistor; and a gate of the second thin-film transistor is suspended and is connected to a second electrode of the second thin-film transistor via the fourth capacitor, and the first electrode of the second thin-film transistor is connected to the second electrode of the second thin-film transistor via the fifth capacitor.

DETAILED DESCRIPTION

Embodiments and features of the present disclosure are described herein with reference to the accompanying drawings.

It should be understood that various modifications can be made to the embodiments applied herein. Therefore, the above specification should not be considered as a limitation, but merely as examples of the embodiments. A person skilled in the art will conceive other modifications within the scope and spirit of the present disclosure.

The accompanying drawings included in the specification and constituting a part of the specification illustrate the embodiments of the present disclosure, and together with the general description of the present disclosure given above and the detailed description of the embodiments given below, are intended to explain the principle of the present disclosure.

These and other characteristics of the present disclosure will become apparent from the following description of preferred forms of embodiments given as non-limiting examples with reference to the accompanying drawings.

It should also be understood that although the present disclosure has been described with reference to some specific examples, a person skilled in the art can doubtlessly implement many other equivalent forms of the present disclosure. These equivalent forms have the features described as in the claims and therefore fall within the scope of protection defined thereby.

With reference to the accompanying drawings, the above and other aspects, features and advantages of the present disclosure may become more apparent in view of the following detailed description.

Hereinafter, specific embodiments of the present disclosure will be described with reference to the accompanying drawings. However, it should be understood that the applied embodiments are merely examples of the present disclosure, and can be implemented in various ways. To avoid unnecessary or redundant details from obscuring the present disclosure, well-known and/or repeated functions and structures are not described in detail. Therefore, the specific structural and functional details applied herein are not intended to be limiting, but merely serve as the basis and representative basis of the claims for teaching a person skilled in the art to use the present disclosure in a variety of ways with substantially any suitable detailed structure.

Phrases "in an embodiment," "in another embodiment," "in yet another embodiment," or "in other embodiments" can be used in this specification, and can all refer to one or more of same or different embodiments according to the present disclosure.

Electrostatic discharge (ESD) may occur during the manufacturing and use of the AMOLED displays and LCDs. When ESD occurs, an insulating medium is usually broken down to cause a short circuit between the gate and the source of a thin-film transistor in a display panel. In severe cases, the entire display panel may be damaged. As a result, electrostatic protection units connected to electrostatic protection wires are usually provided on an array substrate of the display panel so as to prevent signal wires from being damaged by ESD.

An embodiment of the present disclosure provides an electrostatic protection unit, which is mainly applicable to an array substrate of a display. A structure of the electrostatic protection unit will be described below in conjunction with the connection of the electrostatic protection unit in actual use.

Figure 1:
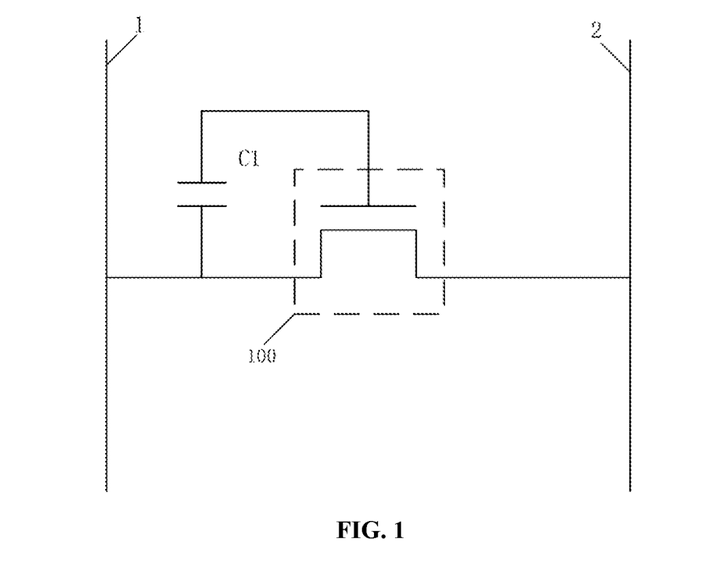
FIG. 1 is a diagram of a circuit structure of an electrostatic protection unit according to an embodiment of the present disclosure.

An embodiment of the present disclosure provides an electrostatic protection unit. FIG. 1 is a diagram of a circuit structure of an electrostatic protection unit according to an embodiment of the present disclosure. As shown in FIG. 1, the electrostatic protection unit includes a first thin-film transistor 100 and a first capacitor C1, wherein a gate of the first thin-film transistor 100 is suspended. The gate of the first thin-film transistor 100 is connected to a first electrode of the first thin-film transistor 100 via the first capacitor C1.

In actual use, the first electrode of the first thin-film transistor 100 is connected to a first conductive wire 1, and a second electrode of the first thin-film transistor 100 is connected to a second conductive wire 2. Optionally, the first conductive wire 1 is a data wire or a gate wire intersected with the data wire, which may be is determined according to actual conditions. The second conductive wire 2 is a data wire or a gate wire or electrostatic protection wire intersected with the data wire.

In an embodiment of the present disclosure, the first electrode is one of a source and a drain, and the second electrode is the other of the source and the drain.

When an electrostatic charge is generated on the first conductive wire 1 of an array substrate, a voltage on the first conductive wire 1 is coupled to the gate of the first thin-film transistor 100 via the first capacitor C1, such that a voltage is generated on the gate; under the action of the voltage on the gate, a conductive path is generated between the first electrode and the second electrode of the first thin-film transistor 100, that is, the first thin-film transistor 100 is turned on; and the electrostatic charge generated on the first conductive wire 1 may be quickly released to the second conductive wire 2.

The electrostatic protection unit provided by this embodiment has a simple structure, and is easy to implement and low in manufacturing cost. In actual use, by the provision of the electrostatic protection unit, when the electrostatic charge is generated on the first conductive wire of the array substrate, the conduction between the first electrode and the second electrode of the first thin-film transistor is enabled via the gate of the first thin-film transistor to further quickly release the electrostatic charge, thereby protecting the array substrate.

Figure 2:
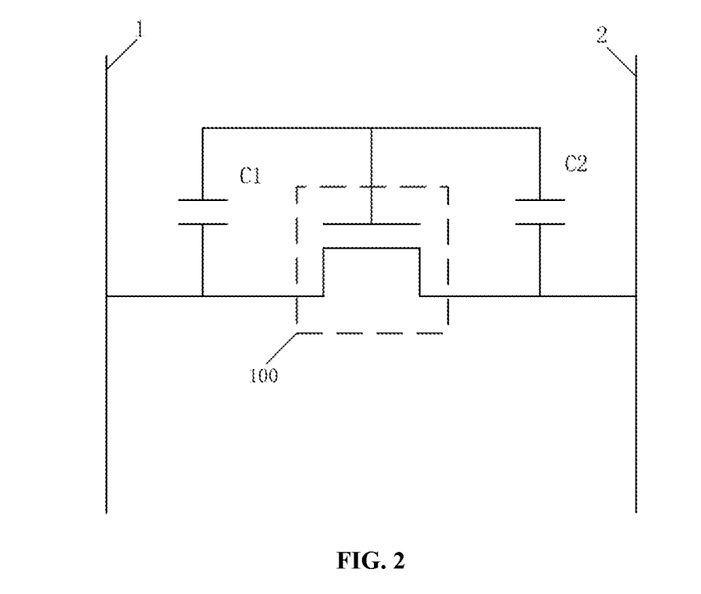
FIG. 2 is a diagram of a circuit structure of an electrostatic protection unit according to another embodiment of the present disclosure.

FIG. 2 is a diagram of a circuit structure of an electrostatic protection unit according to another embodiment of the present disclosure. As shown in FIG. 2, the electrostatic protection unit in FIG. 2 is additionally provided with a second capacitor C2 based on the electrostatic protection unit in FIG. 1. The gate of the first thin-film transistor 100 is connected to the second electrode of the first thin-film transistor 100 via the second capacitor C2.

When an electrostatic charge is generated on the first conductive wire 1, a reference may be made to the embodiment shown in FIG. 1 for a process of releasing the electrostatic charge.

When an electrostatic charge is generated on the second conductive wire 2, a voltage on the second conductive wire 2 is coupled to the gate of the first thin-film transistor 100 via the second capacitor C2, such that a voltage is generated on the gate; under the action of the voltage on the gate, a conductive path is generated between the first electrode and the second electrode of the first thin-film transistor 100; and the electrostatic charge generated on the second conductive wire 2 may be quickly released to the first conductive wire 1.

The electrostatic protection unit provided by this embodiment has a simple structure, and is easy to implement and low in manufacturing cost. In actual use, by the provision of the electrostatic protection unit, when the electrostatic charge is generated on the first or second conductive wire of the array substrate, the conduction between the first electrode and the second electrode of the first thin-film transistor is enabled via the gate of the first thin-film transistor to further quickly release the electrostatic charge, thereby protecting the array substrate.

It should be noted that in the embodiments shown in FIGS. 1 and 2, the second electrode of the first thin-film transistor is directly connected to the second conductive wire, and in other embodiments, the second electrode of the first thin-film transistor may be indirectly connected to the second conductive wire, for example, via other electronic devices (such as the second thin-film transistor). The connection of the first thin-film transistor with the second conductive wire via the second thin-film transistor is illustratively explained below with reference to FIGS. 3 and 4.

Figure 3:
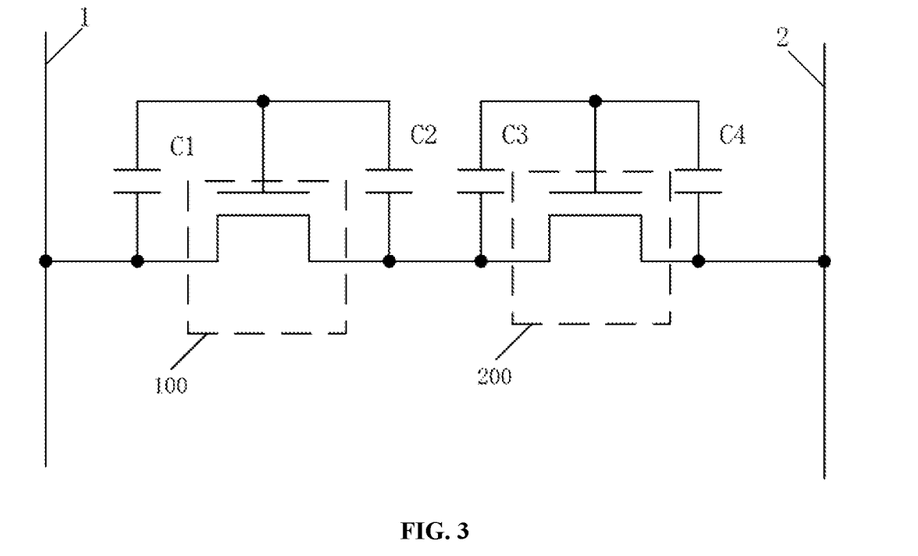
FIG. 3 is a diagram of a circuit structure of an electrostatic protection unit according to still another embodiment of the present disclosure.

An embodiment of the present disclosure further provides another electrostatic protection unit. A structure of the electrostatic protection unit will be described below in conjunction with the connection of the electrostatic protection unit having such a structure in actual use. FIG. 3 is a schematic diagram of a circuit structure of an electrostatic protection unit according to still another embodiment of the present disclosure. As shown in FIG. 3, the electrostatic protection unit according to this embodiment further includes a second thin-film transistor 200, the third capacitor C3 and a fourth capacitor C4 based on the embodiments shown in FIGS. 1 to 2.

The gate of the first thin-film transistor 100 is suspended. The gate of the first thin-film transistor 100 is connected to the first electrode of the first thin-film transistor 100 via the first capacitor C1 and is connected to the second electrode of the first thin-film transistor 100 via the second capacitor C2.

A gate of the second thin-film transistor 200 is suspended. The gate of the second thin-film transistor 200 is connected to a first electrode of the second thin-film transistor 200 via the third capacitor C3 and is connected to a second electrode of the second thin-film transistor 200 via the fourth capacitor C4.

The second electrode of the first thin-film transistor 100 is connected to the first electrode of the second thin-film transistor 200.

In actual use, the first electrode of the first thin-film transistor 100 is connected to the first conductive wire 1, and the second electrode of the second thin-film transistor 200 is connected to the second conductive wire 2. That is, the second electrode of the first thin-film transistor 100 is connected to the second conductive wire 2 via the second thin-film transistor 200.

When an electrostatic charge is generated on the first conductive wire 1, a voltage on the first conductive wire 1 is coupled to the gate of the first thin-film transistor 100 via the first capacitor C1, such that a voltage is generated on the gate of the first thin-film transistor 100; and under the action of the voltage on the gate, a conductive path is generated between the first electrode and the second electrode of the first thin-film transistor 100. Further, since the second electrode of the first thin-film transistor 100 is connected to the first electrode of the second thin-film transistor 200, the electrostatic charge is coupled to the gate of the second thin-film transistor 200 via the third capacitor C3, such that a voltage is generated on the gate of the second thin-film transistor 200; and under the action of the voltage on the gate, a conductive path is generated between the first electrode and the second electrode of the second thin-film transistor 200, thereby releasing the electrostatic charge to the second conductive wire 2.

When an electrostatic charge is generated on the second conductive wire 2, a voltage on the second conductive wire 2 is coupled to the gate of the second thin-film transistor 200 via the fourth capacitor C4, such that a voltage is generated on the gate of the second thin-film transistor 200; and under the action of the voltage on the gate, a conductive path is generated between the first electrode and the second electrode of the second thin-film transistor 200. Further, since the second electrode of the first thin-film transistor 100 is connected to the first electrode of the second thin-film transistor 200, the electrostatic charge is coupled to the gate of the first thin-film transistor 100 via the second capacitor C2, such that a voltage is generated on the gate of the first thin-film transistor 100; and under the action of the voltage on the gate, a conductive path is generated between the first electrode and the second electrode of the first thin-film transistor 100, thereby releasing the electrostatic charge to the first conductive wire 1.

It should be noted that in some embodiments, the second capacitor C2 and the fourth capacitor C4 in FIG. 3 may be removed. After the second capacitor C2 and the fourth capacitor C4 are removed, the electrostatic discharge may be implemented only from the first conductive wire 1 to the second conductive wire 2.

In the embodiment shown in FIG. 3, a plurality of capacitors may play a role of storing electrostatic charges, such that an electrostatic shock may be reduced in an electrostatic discharge process.

Figure 4:
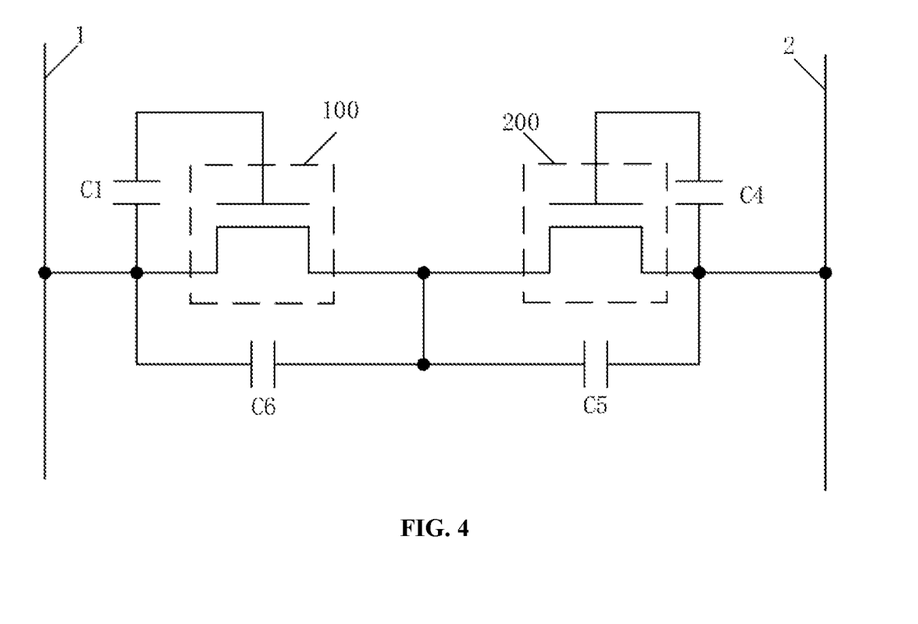
FIG. 4 is a diagram of a circuit structure of an electrostatic protection unit according to yet another embodiment of the present disclosure.

An embodiment of the present disclosure further provides another electrostatic protection unit, whose structure will be described below in conjunction with the connection of the electrostatic protection unit having such a structure in actual use. FIG. 4 is a schematic diagram of a circuit structure of an electrostatic protection unit according to yet another embodiment of the present disclosure. As shown in FIG. 4, the electrostatic protection unit includes: a first thin-film transistor 100, a second thin-film transistor 200, a first capacitor C1, a fourth capacitor C4, a fifth capacitor C5 and a sixth capacitor C6.

A gate of the first thin-film transistor 100 is suspended and is connected to a first electrode of the first thin-film transistor 100 via the first capacitor C1. The first electrode of the first thin-film transistor 100 is connected to a second electrode of the first thin-film transistor 100 via the sixth capacitor C6.

A gate of the second thin-film transistor 200 is suspended and is connected to a second electrode of the second thin-film transistor 200 via the fourth capacitor C4; and a first electrode of the second thin-film transistor 200 is connected to the second electrode of the second thin-film transistor 200 via the fifth capacitor C5.

The second electrode of the first thin-film transistor 100 is connected to the first electrode of the second thin-film transistor 200.

In actual use, the first electrode of the first thin-film transistor 100 is connected to a first conductive wire 1, and the second electrode of the second thin-film transistor 200 is connected to a second conductive wire 2.

When an electrostatic charge is generated on the first conductive wire 1, a voltage on the first conductive wire 1 is coupled to the gate of the first thin-film transistor 100 via the first capacitor C1, such that a voltage is generated on the gate of the first thin-film transistor 100, thereby generating a conductive path between the first electrode and the second electrode of the first thin-film transistor 100. Also, the voltage on the first conductive wire 1 is coupled to the gate of the second thin-film transistor 200 via the sixth capacitor C6, the fifth capacitor C5, and the fourth capacitor C4, such that a conductive path is generated between the first electrode and the second electrode of the second thin-film transistor 200. The electrostatic charge is released to the second conductive wire 2 via the first and second electrodes of the first thin-film transistor 100 and the first and second electrodes of the second thin-film transistor 200.

An electrostatic discharge process when the electrostatic charges are generated on the second conductive wire 2 is similar to an electrostatic discharge process when the electrostatic charges are generated on the first conductive wire 1, the details of which will not be repeated here.

In the embodiment shown in FIG. 4, the fifth capacitor C5 and the sixth capacitor C6 may also provide a pure-capacitor discharge pathway to further ensure an electrostatic discharge effect.

An embodiment of the present disclosure further provides an array substrate. The array substrate includes a first conductive wire, a second conductive wire, and any one of the electrostatic protection units as previously defined. The electrostatic protection unit is connected between the first conductive wire and the second conductive wire.

Optionally, the first conductive wire is one of a gate wire, a data wire, and an electrostatic protection wire, and the second conductive wire is one of a gate wire, a data wire, and an electrostatic protection wire. The number of the electrostatic protection units included in the array substrate and the types of the first and second conductive wires connected to the electrostatic protection units may be set according to actual needs, which are not limited in the embodiments of the present disclosure.

Optionally, the electrostatic protection unit may be one or more of the electrostatic protection units shown in FIGS. 1 to 4.

Figure 5:
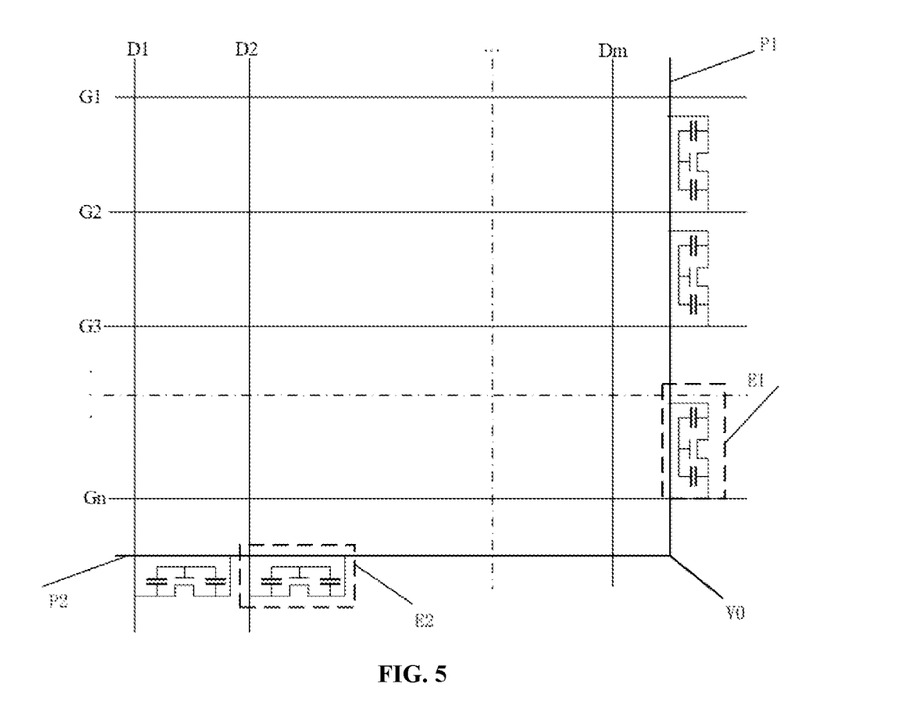
FIG. 5 is a schematic structural diagram of an array substrate according to an embodiment of the present disclosure.

FIG. 5 is a schematic diagram of a planar structure of an array substrate according to an embodiment of the present disclosure. As shown in FIG. 5, the array substrate includes a plurality of data wires D1-Dm, a plurality of gate wires G1-Gn, a first electrostatic protection wire P1, a second electrostatic protection wire P2, a first electrostatic protection units E1, and a second electrostatic protection units E2.

The array substrate includes a display area and a peripheral area surrounding the display area. The plurality of data wires D1-Dm and the plurality of gate wires G1-Gn intersect to form a plurality of pixel units, each of which is connected to a corresponding gate wire and a corresponding data wire. The plurality of pixel units are disposed in the display area.

An extension direction of the first electrostatic protection wire P1 is the same as an extension direction of each of the data wires, and an extension direction of the second electrostatic protection wire P2 is the same as an extension direction of each of the gate wires. The first electrostatic protection units E1 are connected between the first electrostatic protection wire P1 and the gate wires, and the second electrostatic protection units E2 are connected between the second electrostatic protection wire P2 and the data wires. The first electrostatic protection wire P1, the second electrostatic protection wire P2, the first electrostatic protection units E1, and the second electrostatic protection units E2 are all disposed in the peripheral area.

As shown in FIG. 5, first electrodes of first thin-film transistors of the first electrostatic protection units E1 are connected to the gate wires, and second electrodes of the first thin-film transistors of the first electrostatic protection units E1 are connected to the first electrostatic protection wires P1. First electrodes of first thin-film transistors of the second electrostatic protection units E2 are connected to the data wires, and second electrodes of the first thin-film transistors of the second electrostatic protection units E2 are connected to the second electrostatic protection wire P2.

Optionally, the first electrostatic protection wire and the second electrostatic protection wire may be electrically connected. For example, the first electrostatic protection wire P1 and the second electrostatic protection wire P2 are connected on the array substrate.

Optionally, a reference voltage may be provided for the first electrostatic protection wire P1 and the second electrostatic protection wire P2. As an example, the first electrostatic protection wire P1 and the second electrostatic protection wire P2 may be connected to a reference voltage input terminal by an outgoing wire; the reference voltage input terminal is connected to a flexible circuit board (FPC) by which a reference voltage is provided to reduce a leakage current caused by the suspending gates of the thin-film transistors of the electrostatic protection units. Optionally, the reference voltage may be a common voltage for cathodes of an AMOLED or a common voltage of an LCD, or may be another voltage different from the common voltage for the cathodes of the AMOLED or the common voltage of the LCD.

It should be noted that the circuit structure of the first and second electrostatic protection units E1 and E2 shown in FIG. 5 is the same as the circuit structure of the electrostatic protection unit shown in FIG. 2. That is, the electrostatic protection unit in the embodiment shown in FIG. 2 is used in the array substrate in FIG. 5. In actual use, at least one of the first electrostatic protection unit E1 and the second electrostatic protection unit E2 may be replaced with the electrostatic protection unit in the embodiment shown in FIG. 1 or FIG. 3 or FIG. 4 according to needs. In addition, the circuit structure of the first electrostatic protection unit E1 may be the same as or different from the structure of the second electrostatic protection unit E2.

Figure 6:
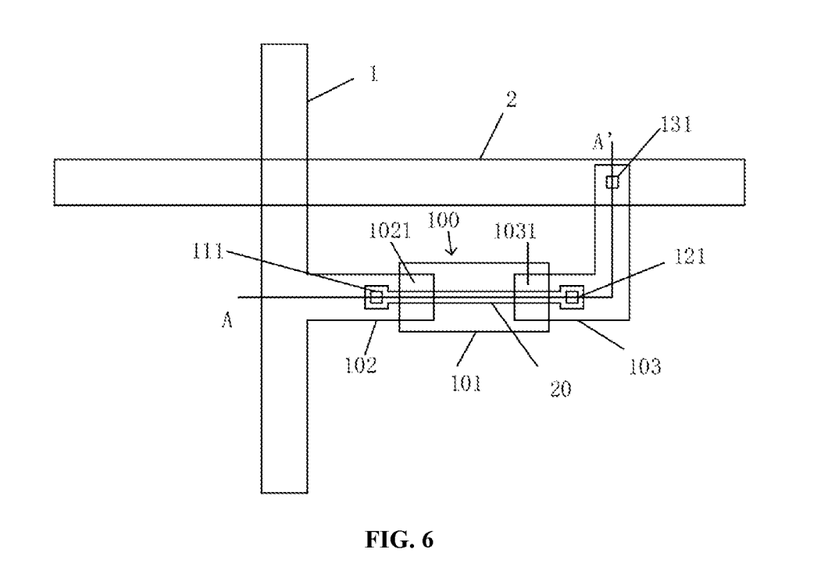
FIG. 6 is a schematic diagram of a planar structure of an electrostatic protection unit of an array substrate according to an embodiment of the present disclosure.
Figure 7:
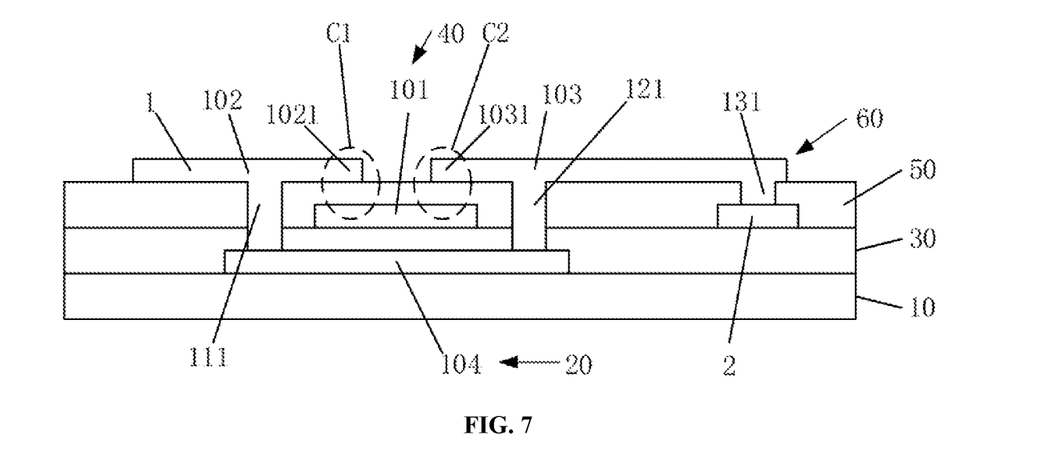
FIG. 7 is a schematic cross-sectional structure diagram of the electrostatic protection unit in FIG. 6 along a line AA'.

FIG. 6 is a schematic diagram of a planar structure of an electrostatic protection unit on the array substrate shown in FIG. 5. FIG. 7 is a schematic cross-sectional structure diagram of the sectional structure of the electrostatic protection unit in FIG. 6 along a line AA' wire.

As shown in FIG. 7, the array substrate includes a substrate 10 and a semiconductor layer 20, a gate insulating layer 30, a gate layer 40, an interlayer insulating layer 50 and a source-drain layer 60 which are sequentially laminated on the substrate 10.

An active layer 104 of the first thin-film transistor 100 is disposed in the semiconductor layer 20; a gate 101 of the first thin-film transistor 100 is disposed in the gate layer 40; and the first electrode 102 and the second electrode 103 of the first thin-film transistor 100 are both disposed in the source-drain layer 60.

With reference to FIGS. 6 and 7, the gate 101 of the first thin-film transistor 100 is suspended. The first electrode 102 of the first thin-film transistor 100 is connected to the active layer 104 of the first thin-film transistor 100 via a first via hole 111 passing through the interlayer insulating layer 50 and the gate insulating layer 30.

The first electrode 102 of the first thin-film transistor 100 includes a first extension 1021; an overlap area between the first extension 1021 and the gate 101 is called a first overlap portion; the first overlap portion and the gate 101 respectively serve as both polar plates of a first capacitor C1 to form the first capacitor C1; and the interlayer insulating layer 50 in an area corresponding to the first capacitor C1 serves as an insulating medium for the first capacitor C1.

The second electrode 103 of the first thin-film transistor 100 is connected to the active layer 104 of the first thin-film transistor 100 via a second via hole 121 passing through the interlayer insulating layer 50 and the gate insulating layer 30; the second electrode 103 of the first thin-film transistor 100 includes a second extension 1031; an overlap area between the second extension 1031 and the gate 101 is called a second overlap portion; the second overlap portion and the gate 101 respectively serve as both polar plates of a second capacitor C2 to form the second capacitor C2; and the interlayer insulating layer 50 in an area corresponding to the second capacitor C2 serves as an insulating medium for the second capacitor C2.

In addition, based on the connection pattern of the electrostatic protection unit on the array substrate in FIG. 6 or 7, the first electrode 102 of the first thin-film transistor 100 is connected to the first conductive wire 1, and the second electrode 103 of the first thin-film transistor 100 is connected to the second conductive wire 2 via a third via hole 131 passing through the interlayer insulating layer 50.

It should be noted that in the embodiments shown in FIG. 6 and FIG. 7, a first conductive wire 1 is disposed in the source-drain layer 60, and a second conductive wire 2 is disposed in the gate layer 40. That is, the first conductive wire 1 is the data wire in FIG. 5, and the second conductive wire 2 is the second electrostatic protection conductive wire P2.

Figure 8:
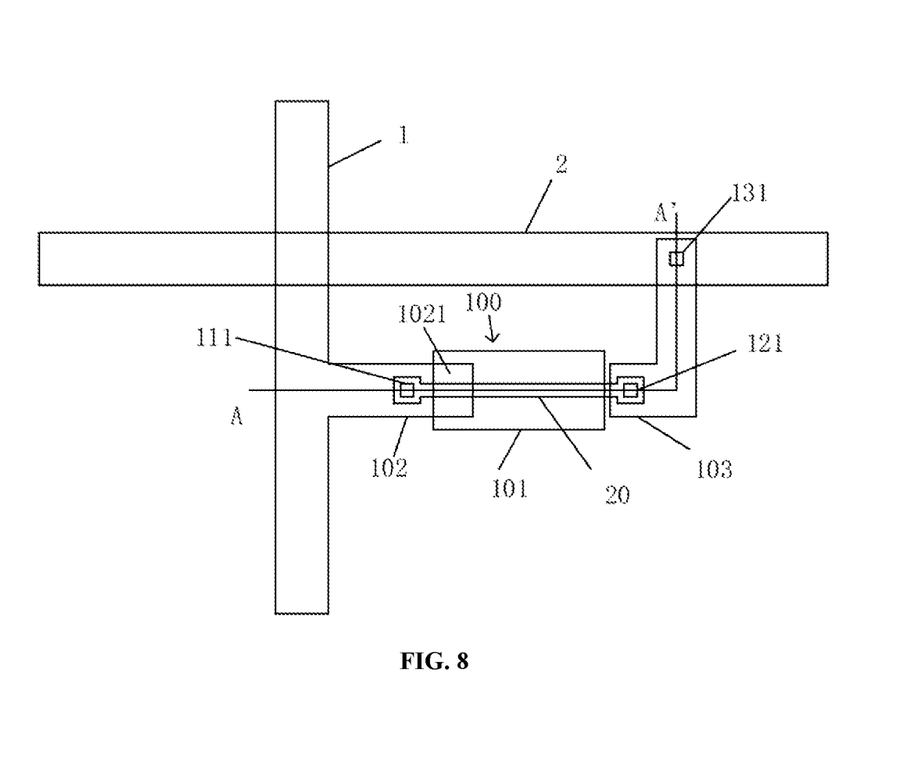
FIG. 8 is a schematic diagram of a planar structure of an electrostatic protection unit of an array substrate according to another embodiment of the present disclosure.
Figure 9:
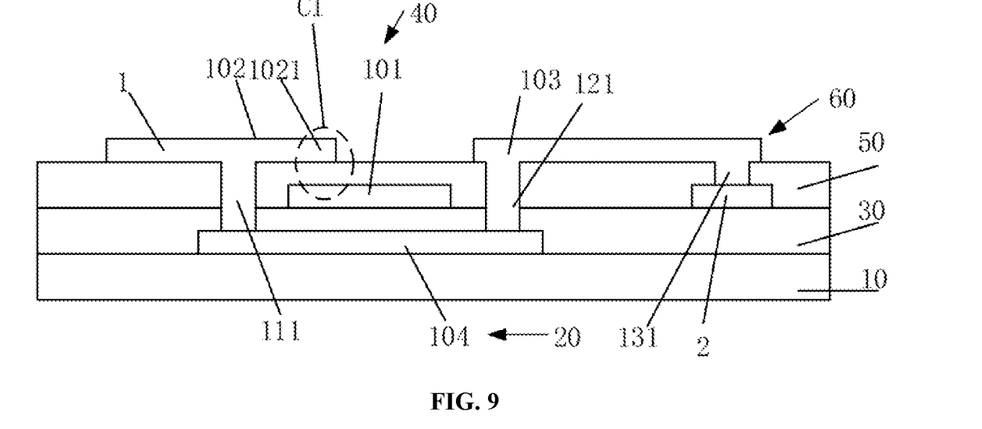
FIG. 9 is a schematic cross-sectional structure diagram of the electrostatic protection unit in FIG. 8 along a line AA'.

FIG. 8 is a schematic diagram of a planar structure of the electrostatic protection unit on the array substrate shown in FIG. 5 after the electrostatic protection unit is replaced with the electrostatic protection unit shown in FIG. 1. FIG. 9 is a schematic cross-sectional structure diagram of the electrostatic protection unit in FIG. 8 along a line AA' wire.

Compared with the electrostatic protection units shown in FIGS. 6 and 7, there is no overlap between the second electrode 103 of the first thin-film transistor 100 and the gate 101 of the first thin-film transistor 100 in each of the electrostatic protection units shown in FIGS. 8 and 9. Therefore, the first electrostatic protection unit does not include the second capacitor C2.

Figure 10:
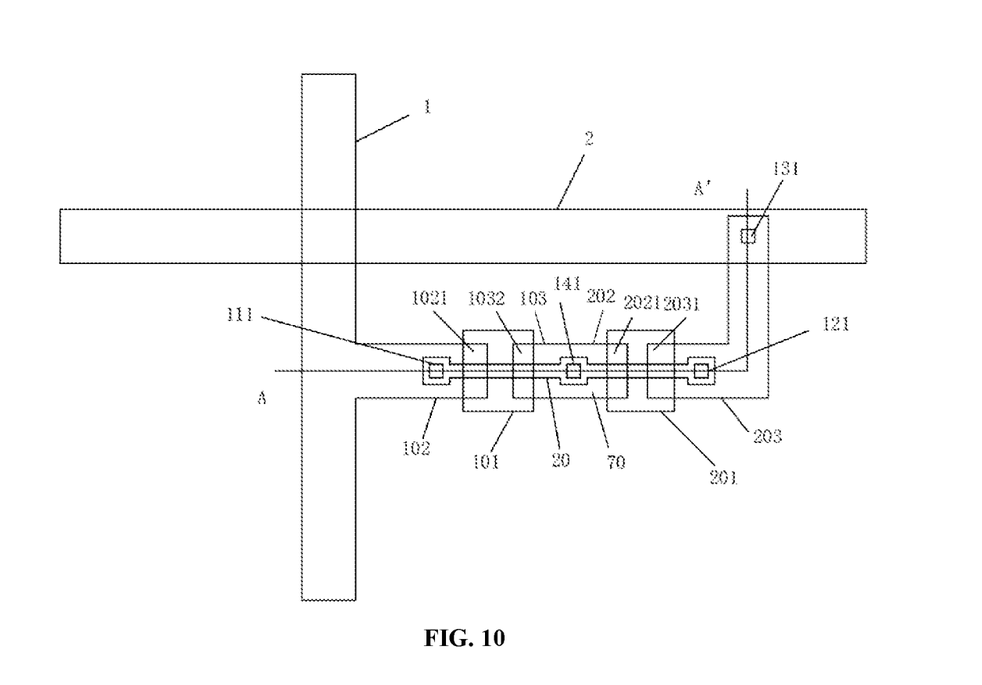
FIG. 10 is a schematic diagram of a planar structure of an electrostatic protection unit according to another embodiment of the present disclosure.
Figure 11:
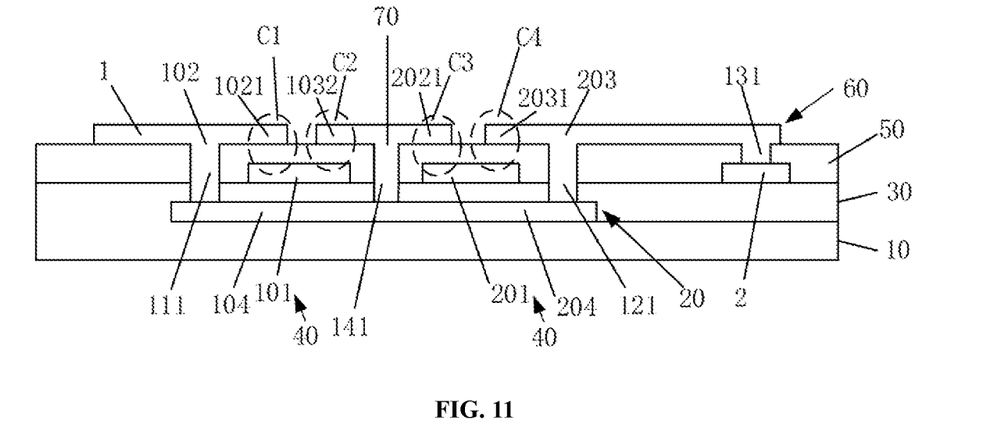
FIG. 11 is a sectional view of the electrostatic protection unit in FIG. 10 along a line AA'.

FIG. 10 is a schematic diagram of a planar structure of the electrostatic protection unit on the array substrate shown in FIG. 5 after the electrostatic protection unit is replaced with the electrostatic protection unit shown in FIG. 3. FIG. 11 is a schematic diagram of a sectional structure of the electrostatic protection unit in FIG. 10 along a line AA'.

As shown in FIG. 11, the array substrate includes a substrate 10 and a semiconductor layer 20, a gate insulating layer 30, a gate layer 40, an interlayer insulating layer 50 and a source-drain layer 60 which are sequentially laminated on the substrate 10.

An active layer 104 of the first thin-film transistor 100 and an active layer 204 of the second thin-film transistor 200 are disposed in the semiconductor layer 20; the gate 101 of the first thin-film transistor 100 and the gate 201 of the second thin-film transistor 200 are both disposed in the gate layer 40; and the first and second poles 102 and 103 of the first thin-film transistor 100 and the first and second poles 202 and 203 of the second thin-film transistor 200 are both disposed in the source-drain layer 60. It should be noted that the active layer 104 of the first thin-film transistor 100 and the active layer 204 of the second thin-film transistor 200 are of an integral structure.

With reference to FIGS. 10 and 11, the gate 101 of the first thin-film transistor 200 is suspended. A first electrode 102 of the first thin-film transistor 100 is connected to the active layer 104 of the first thin-film transistor via the first via hole 111 passing through the interlayer insulating layer 50 and the gate insulating layer 30. The first electrode 102 of the first thin-film transistor 100 includes a first extension 1021; an overlap area between the first extension 1021 and the gate 101 of the first thin-film transistor 100 is called a first overlap portion; the first overlap portion and the suspending gate 101 respectively serve as both polar plates of a first capacitor C1 to form the first capacitor C1; and the interlayer insulating layer 50 in an area corresponding to the first capacitor C1 serves as an insulating medium for the first capacitor C1. The second electrode 103 of the first thin-film transistor 100 includes a second extension 1032; an overlap area between the second extension 1032 and the gate 101 of the first thin-film transistor 100 is called a second overlap portion; the second overlap portion and the gate 101 respectively serve as both polar plates of a second capacitor C2 to form the second capacitor C2; and the interlayer insulating layer 50 in an area corresponding to the second capacitor C2 serves as an insulating medium for the second capacitor C2.

A gate 201 of the second thin-film transistor 200 is suspended. A first electrode 202 of the second thin-film transistor 200 includes a third extension 2021; a third overlap portion is provided between the third extension 2021 and the gate 201 of the second thin-film transistor 200; the third overlap portion and the gate 201 respectively serve as both polar plates of a third capacitor C3 to form the third capacitor C3; and the interlayer insulating layer 50 in an area corresponding to the third capacitor C3 serves as an insulating medium for the third capacitor C3. A second electrode 203 of the second thin-film transistor 200 includes a fourth extension 2031; a fourth overlap portion is provided between the fourth extension 2031 and the gate 201 of the second thin-film transistor 200; the fourth overlap portion and the gate 201 respectively serve as both polar plates of a fourth capacitor C4 to form the fourth capacitor C4; and the interlayer insulating layer 50 in an area corresponding to the fourth capacitor C4 serves as an insulating medium for the fourth capacitor C4. The second electrode 203 of the second thin-film transistor 200 is connected to the active layer 204 of the second thin-film transistor 200 via a second via hole 121 passing through the interlayer insulating layer 50 and the gate insulating layer 30.

In addition, based on the connection pattern of the electrostatic protection unit on the array substrate in FIG. 10 or 11, the first electrode 102 of the first thin-film transistor 100 is connected to the first conductive wire 1, and the second electrode 203 of the second thin-film transistor 200 is connected to the second conductive wire 2 via a third via hole 131 passing through the interlayer insulating layer 50. For the content related to the first conductive wire 1 and the second conductive wire 2, a reference may be made to the relevant parts of the embodiments shown in FIG. 6 and FIG. 7, the details of which will not be repeated here.

The second thin-film transistor 200 is connected in series with the first thin-film transistor 100, and the first electrode 202 of the second thin-film transistor 200 is connected to the second electrode 103 of the first thin-film transistor 100. For example, the first electrode 202 of the second thin-film transistor 200 and the second electrode 103 of the first thin-film transistor 100 are of an integral structure 70, which is connected to the semiconductor layer 20 via a fourth via hole 11 passing through the interlayer insulating layer 50 and the gate insulating layer 30.

Optionally, a T-shaped source and/or drain metal layer is used as the integral structure 70, one end of which is the second extension 1032, and the other end of which is the third extension 2021. In actual use, a metal layer having a different shape may also be utilized to achieve the same effect, which is not limited in this embodiment.

Figure 12:
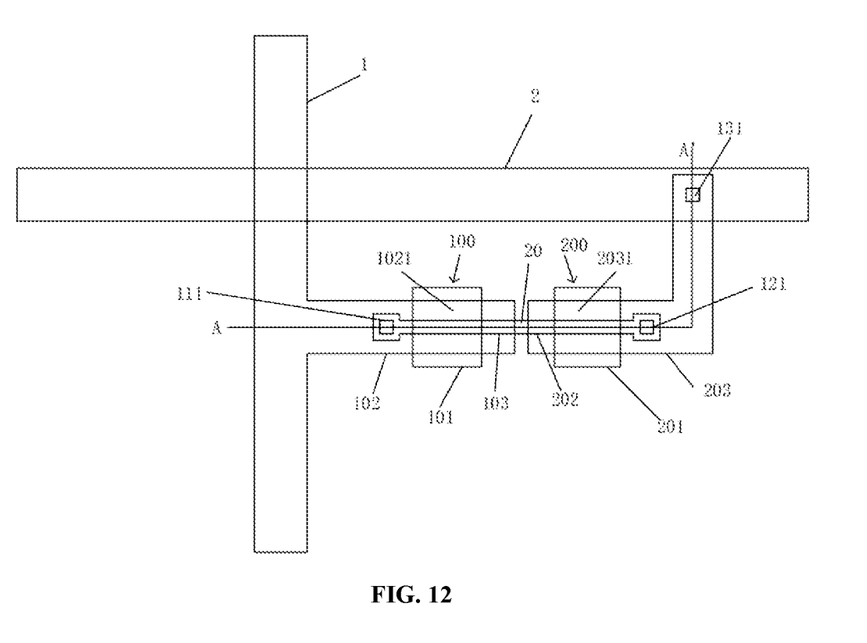
FIG. 12 is a schematic diagram of a planar structure of an electrostatic protection unit according to still another embodiment of the present disclosure.
Figure 13:
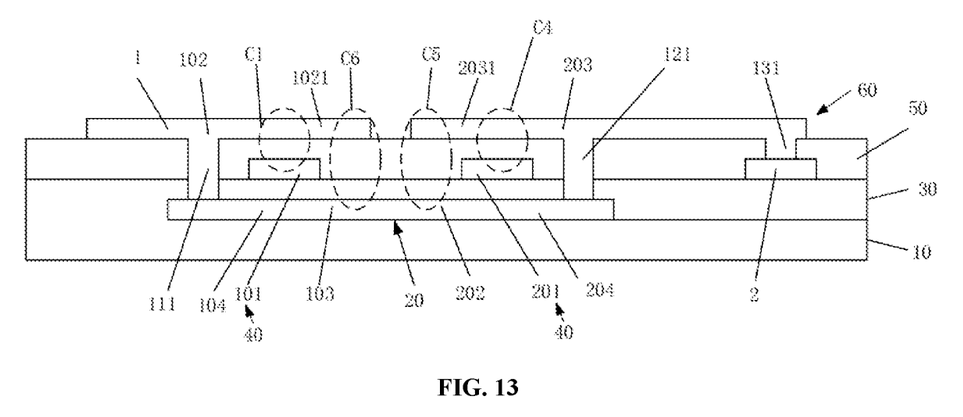
FIG. 13 is a schematic cross-sectional structure diagram of a sectional structure of the electrostatic protection unit in FIG. 12 along a line AA'.

FIG. 12 is a schematic diagram of a planar structure of the electrostatic protection unit on the array substrate shown in FIG. 5 after the electrostatic protection unit is replaced with the electrostatic protection unit shown in FIG. 4. FIG. 13 is a schematic cross-sectional structure diagram of a sectional structure of the electrostatic protection unit in FIG. 12 along a line AA'.

As shown in FIG. 13, the array substrate includes a substrate 10 and a semiconductor layer 20, a gate insulating layer 30, a gate layer 40, an interlayer insulating layer 50 and a source-drain layer 60 which are sequentially laminated on the substrate 10.

An active layer 104 of the first thin-film transistor 100 and an active layer 204 of the second thin-film transistor 200 are both disposed in the semiconductor layer 20. The gate 101 of the first thin-film transistor 100 and the gate 201 of the second thin-film transistor 200 are both disposed in the gate layer 40. The first electrode 102 of the first thin-film transistor 100 and the second electrode 203 of the second thin-film transistor 200 are both disposed in the source-drain layer 60. It should be noted that the active layer 104 of the first thin-film transistor 100 and the active layer 204 of the second thin-film transistor 200 are of an integral structure, which has a metalized area. The metalized area includes the second electrode 106 of the first thin-film transistor 100 and the first electrode 202 of the second thin-film transistor 200. The metalized area then allows partial areas of the integral structure to be metalized into a conductor.

As shown in FIGS. 12 and 13, the gate 101 of the first thin-film transistor 100 is suspended. The first electrode 102 of the first thin-film transistor 100 is connected to the active layer 104 of the first thin-film transistor 100 via a first via hole 111 passing through the interlayer insulating layer 50 and the gate insulating layer 30. The first electrode 102 of the first thin-film transistor 100 includes a first extension 1021; an overlap area between the first extension 1021 and the gate 101 of the first thin-film transistor 100 is called a first overlap portion; the first overlap portion and the gate 101 respectively serve as both polar plates of a first capacitor C1 to form the first capacitor C1; and the interlayer insulating layer 40 in an area corresponding to the first capacitor C1 serves as an insulating medium for the first capacitor C1.

The gate 201 of the second thin-film transistor 200 is suspended. The second electrode 203 of the second thin-film transistor 200 is connected to the active layer 204 via a second via hole 121 passing through the interlayer insulating layer 50 and the gate insulating layer 30. The second electrode 203 of the second thin-film transistor 200 includes a fourth extension 2031; a fourth overlap portion is provided between the fourth extension 2031 and the gate 201 of the second thin-film transistor 200; the fourth overlap portion and the gate 201 respectively serve as both polar plates of a fourth capacitor C4 to form the fourth capacitor C4; and the interlayer insulating layer 50 in an area corresponding to the fourth capacitor C4 serves as an insulating medium for the fourth capacitor C4.

A fifth overlap portion is provided between the fourth extension 2031 and the first electrode 202 of the second thin-film transistor 200 in the semiconductor layer 20; the fifth overlap portion and the first electrode 202 of the second thin-film transistor 200 in the semiconductor layer 20 form a fifth capacitor C5; and the gate insulating layer 30 and the interlayer insulating layer 50 in an area corresponding to the fifth capacitor C5 serve as an insulating medium for the fifth capacitor C5.

A sixth overlap portion is provided between the first extension 1021 and the second electrode 103 of the first thin-film transistor 100 in the semiconductor layer 20; the sixth overlap portion and the second electrode 103 of the first thin-film transistor 100 in the semiconductor layer 20 form a sixth capacitor C6; and the gate insulating layer 30 and the interlayer insulating layer 50 in an area corresponding to the sixth capacitor C6 serve as an insulating medium for the sixth capacitor C6.

In addition, based on the connection pattern of the electrostatic protection unit on the array substrate in FIG. 12 or 13, the first electrode 102 of the first thin-film transistor 100 is connected to the first conductive wire 1, and the second electrode 203 of the second thin-film transistor 200 is connected to the second conductive wire 2 via a third via hole 131 passing through the interlayer insulating layer 50. For the content related to the first conductive wire 1 and the second conductive wire 2, a reference may be made to the relevant parts of the embodiments shown in FIG. 6 and FIG. 7, the details of which will not be repeated here.

Figure 14:
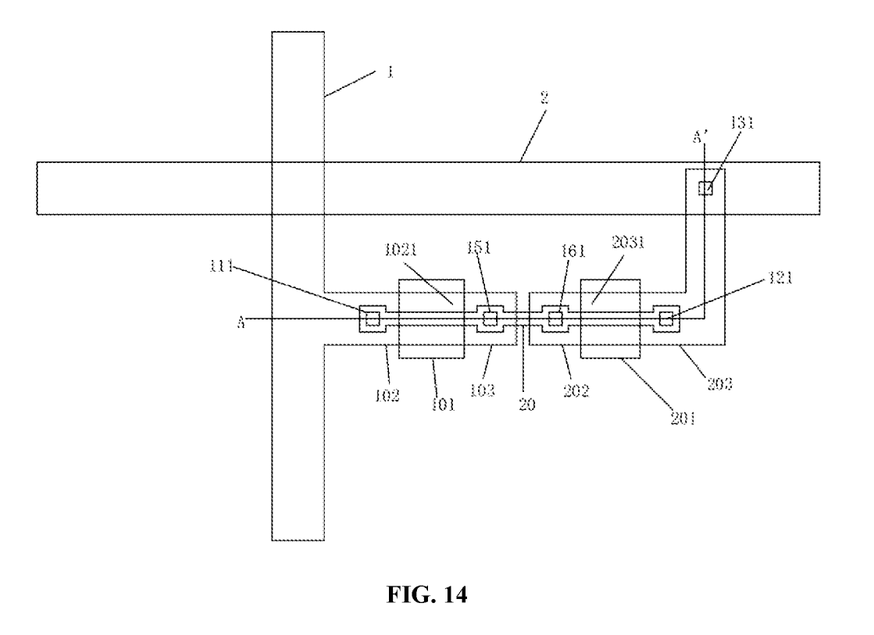
FIG. 14 is a schematic diagram of a planar structure of an electrostatic protection unit according to yet another embodiment of the present disclosure.
Figure 15:
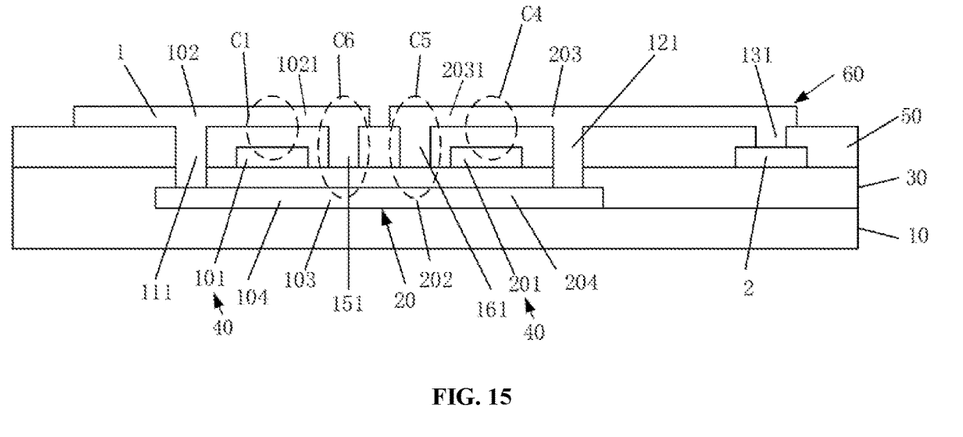
FIG. 15 is a schematic cross-sectional structure diagram of a sectional structure of the electrostatic protection unit in FIG. 14 along a line AA'.

FIG. 14 is a schematic diagram of another planar structure of the electrostatic protection unit on the array substrate shown in FIG. 5 after the electrostatic protection unit is replaced with the electrostatic protection unit shown in FIG. 4. FIG. 15 is a schematic cross-sectional structure diagram of a sectional structure of the electrostatic protection unit in FIG. 14 along a line AA'.

Compared with the array substrates shown in FIGS. 12 and 13, in each of the array substrates shown in FIGS. 14 and 15, a fifth via hole 151 is provided on the interlayer insulating layer 50 at a position corresponding to the second electrode 103 of the first thin-film transistor 100 on the semiconductor layer 20; a portion of the first extension 1021 is disposed in the fifth via hole 151, and here, the sixth overlap portion is disposed in the fifth via hole; and the insulating medium of the sixth capacitor C6 is the gate insulating layer 30 corresponding to the position of the fifth via hole 151.

In addition, a sixth via hole 161 is provided on the interlayer insulating layer 50 at a position corresponding to the first electrode 202 of the second thin-film transistor 200 on the semiconductor layer 20; a portion of the fourth extension 2031 is disposed in the sixth via hole 161, and here, the fifth overlap portion is disposed in the sixth via hole; and the insulating medium of the fifth capacitor C5 is the gate insulating layer 30 corresponding to the position of the sixth via hole 161.

Optionally, in the embodiments of the present disclosure, a material of the semiconductor layer 20 may be any one of amorphous silicon, polysilicon, and oxide semiconductor, for example, an oxide semiconductor material such as indium gallium zinc oxide (IGZO).

Optionally, an aspect ratio of an oxide semiconductor channel of the first thin-film transistor is less than $1/20$ and greater than $1/100$; and an aspect ratio of an oxide semiconductor channel of the second thin-film transistor is less than $1/20$ and greater than $1/100$.

In addition, all the gates, sources and drains in this embodiment may be made of metal materials such as copper (Cu), aluminum (Al), molybdenum (Mo), titanium (Ti), chromium (Cr) and tungsten (W), or alloys of these materials, and may have a single-layer structure or a multi-layer structure, such as Mo/Al/Mo and Ti/Cu/Ti, Mo/Ti/Cu. Both the gate insulating layer and the interlayer insulating layer may be made of silicon nitride or silicon oxide, and may have a single-layer structure or a multi-layer structure, such as a composite structure of silicon nitride and silicon oxide.

According to the embodiments of the present disclosure, the electrostatic protection unit is installed on the array substrate, such that when electrostatic charges are generated on the data wires or gate wires of the array substrate, the electrostatic charges are released quickly by means of the electrostatic protection units connected between the signal wires (i.e., the gate wires or the data wires), thereby reducing the damage caused by electrostatic electricity to the array substrate. Moreover, the electrostatic protection unit according to the embodiments is simple in structure, lower in manufacturing cost and convenient for implementation and mass production.

An embodiment of the present disclosure further provides a display device, which includes any one of the array substrates as previously defined.

Optionally, the display device may be an AMOLED display or an LCD.

As an example, the display device may be any product or component with a display function, for example, a mobile phone, a tablet computer, a television, a display, a notebook computer, a digital photo frame, and a navigator.

What is claimed is:

1. An array substrate, comprising: a first conductive wire, a second conductive wire and a first electrostatic protection unit, wherein the first electrostatic protection unit comprises a first thin-film transistor and a first capacitor; wherein
   a gate of the first thin-film transistor is suspended and is connected to a first electrode of the first thin-film transistor via the first capacitor, the first electrode of the thin-film transistor is connected to the first conductive wire, and a second electrode of the first thin-film transistor is connected to the second conductive wire; and
   the array substrate further comprises: a third conductive wire, a fourth conductive wire and a second electrostatic protection unit, wherein the second electrostatic protection unit is connected between the third conductive wire and the fourth conductive wires, and the second electrostatic protection unit is in a same structure as the first electrostatic protection unit;
   wherein the first conductive wire is the gate wire, the second conductive wire is the first electrostatic protection wire, the third conductive wire is the data wire, the fourth conductive wire is the second electrostatic protection wire, the data wire is intersected with the gate wire, an extension direction of the first electrostatic protection wire is the same as an extension direction of the data wire, and an extension direction of the second electrostatic protection wire is the same as an extension direction of the gate wire.

2. The array substrate according to claim 1, wherein the first electrostatic protection unit further comprises: a second capacitor; wherein the gate of the first thin-film transistor is connected to the second electrode of the first thin-film transistor via the second capacitor.

3. The array substrate according to claim 1, wherein the first electrostatic protection unit further comprises a second thin-film transistor and a third capacitor; wherein
a gate of the second thin-film transistor is suspended and is connected to a first electrode of the second thin-film transistor via the third capacitor, the first electrode of the second thin-film transistor is connected to the second electrode of the first thin-film transistor, and a second electrode of the second thin-film transistor is connected to the second conductive wire, such that the second electrode of the first thin-film transistor is connected to the second conductive wire via the second thin-film transistor.

4. The array substrate according to claim 3, wherein the first electrostatic protection unit further comprises a fourth capacitor; wherein
the gate of the second thin-film transistor is connected to the second electrode of the second thin-film transistor via the fourth capacitor.

5. The array substrate according to claim 4, further comprising: a substrate, and a semiconductor layer, a gate insulating layer, a gate layer, an interlayer insulating layer, and a source-drain layer which are sequentially laminated on the substrate; wherein
an active layer of the first thin-film transistor and an active layer of the second thin-film transistor are disposed in the semiconductor layer and are of an integral structure that has a metalized area, the gate of the first thin-film transistor and the gate of the second thin-film transistor are disposed in the gate layer, the first electrode of the first thin-film transistor and the second electrode of the second thin-film transistor are disposed in the source-drain layer, and the second electrode of the first thin-film transistor and the first electrode of the second thin-film transistor are disposed in the metalized area;
the first electrode of the first thin-film transistor comprises a first overlap portion overlapped with the gate of the first thin-film transistor, the first overlap portion and the gate of the first thin-film transistor forming the first capacitor, and the first electrode of the first thin-film transistor comprises a sixth overlap portion overlapped with the metalized area, the sixth overlap portion and the metallized area forming a sixth capacitor, and the first electrode of the first thin-film transistor is connected to the active layer of the first thin-film transistor via a first via hole, the first via hole passing through the interlayer insulating layer and the gate insulating layer; and
the second electrode of the second thin-film transistor comprises a fourth overlap portion overlapped with the gate of the second thin-film transistor, the fourth overlap portion and the gate of the second thin-film transistor forming the fourth capacitor, and the second electrode of the second thin-film transistor comprises a fifth overlap portion overlapped with the metallized area, the fifth overlap portion and the metallized area forming a fifth capacitor, and the second electrode of the second thin-film transistor is connected to the active layer of the second thin-film transistor via a second via hole, the second via hole passing through the interlayer insulating layer and the gate insulating layer.

6. The array substrate according to claim 4, further comprising: a substrate, and a semiconductor layer, a gate insulating layer, a gate layer, an interlayer insulating layer, and a source-drain layer which are sequentially laminated on the substrate; wherein
an active layer of the first thin-film transistor and an active layer of the second thin-film transistor are disposed in the semiconductor layer and are of an integral structure that has a metalized area, the gate of the first thin-film transistor and the gate of the second thin-film transistor are disposed in the gate layer, the first electrode of the first thin-film transistor and the second electrode of the second thin-film transistor are disposed in the source-drain layer, and the second electrode of the first thin-film transistor and the first electrode of the second thin-film transistor are disposed in the metalized area;
the first electrode of the first thin-film transistor comprises a first overlap portion overlapped with the gate of the first thin-film transistor, the first overlap portion and the gate of the first thin-film transistor forming the first capacitor, a portion of the first electrode of the first thin-film transistor is disposed in a fifth via hole that is disposed in the interlayer insulating layer at a position corresponding to the second electrode of the first thin-film transistor, wherein the portion of the first electrode of the first thin-film transistor disposed in the fifth via hole comprises a sixth overlap portion overlapped with the metalized area, the sixth overlap portion and the metalized area forming a sixth capacitor, and the first electrode of the first thin-film transistor is connected to the active layer of the first thin-film transistor via a first via hole, the first via hole passing through the interlayer insulating layer and the gate insulating layer; and
the second electrode of the second thin-film transistor comprises a fourth overlap portion overlapped with the gate of the second thin-film transistor, the fourth overlap portion and the gate of the second thin-film transistor forming the fourth capacitor, a portion of the second electrode of the second thin-film transistor is disposed in a sixth via hole that is disposed in the interlayer insulating layer at a position corresponding to the first electrode of the second thin-film transistor, wherein the portion of the second electrode of the second think-film transistor disposed in the sixth via hole comprises a fifth overlap portion overlapped with the metalized area, the fifth overlap portion and the metalized area forming a fifth capacitor, and the second electrode of the second thin-film transistor is connected to the active layer of the second thin-film transistor via a second via hole, the second via hole passing through the interlayer insulating layer and the gate insulating layer.

7. The array substrate according to claim 3, comprising: a substrate, and a semiconductor layer, a gate insulating layer, a gate layer, an interlayer insulating layer, and a source-drain layer which are sequentially laminated on the substrate; wherein
an active layer of the first thin-film transistor and an active layer of the second thin-film transistor are disposed in the semiconductor layer, the gate of the first thin-film transistor and the gate of the second thin-film transistor are disposed in the gate layer, and the first electrode and the second electrode of the first thin-film transistor and the first electrode and the second electrode of the second thin-film transistor are disposed in the source-drain layer;
the first electrode of the first thin-film transistor comprises a first overlap portion overlapped with the gate of the first thin-film transistor, the first overlap portion and the gate of the first thin-film transistor forming the first capacitor, the first electrode of the first thin-film transistor is connected to the active layer of the first thin-film transistor via a first via hole, and the second electrode of the first thin-film transistor is connected to the active layer of the first thin-film transistor via a fourth via hole; and the first electrode of the second thin-film transistor comprises a third overlap portion overlapped with the gate of the second thin-film transistor, the third overlap portion and the gate of the second thin-film transistor forming the third capacitor, the first electrode of the second thin-film transistor is connected to the active layer of the second thin-film transistor via the fourth via hole, and the second electrode of the second thin-film transistor is connected to the active layer of the second thin-film transistor via a second via hole;

wherein the first via hole, the second via hole and the fourth via hole pass through the interlayer insulating layer and the gate insulating layer.

8. The array substrate according to claim 7, wherein the second electrode of the first thin-film transistor comprises a second overlap portion overlapped with the gate of the first thin-film transistor, the second overlap portion and the gate of the first thin-film transistor forming the second capacitor; and/or the second electrode of the second thin-film transistor comprises a fourth overlap portion overlapped with the gate of the second thin-film transistor, the fourth overlap portion and the gate of the second thin-film transistor forming a fourth capacitor.

9. The array substrate according to claim 1, wherein the first electrostatic protection unit further comprises: a second thin-film transistor, a fourth capacitor, a fifth capacitor, and a sixth capacitor; wherein the first electrode of the first thin-film transistor is connected to the second electrode of the first thin-film transistor via the sixth capacitor, the second electrode of the first thin-film transistor is connected to a first electrode of the second thin-film transistor, a gate of the second thin-film transistor is suspended and is connected to a second electrode of the second thin-film transistor via the fourth capacitor, and the first electrode of the second thin-film transistor is connected to the second electrode of the second thin-film transistor via the fifth capacitor.

10. The array substrate according to claim 1, further comprising: a substrate, and a semiconductor layer, a gate insulating layer, a gate layer, an interlayer insulating layer, and a source-drain layer which are sequentially laminated on the substrate; wherein an active layer of the first thin-film transistor is disposed in the semiconductor layer, the gate of the first thin-film transistor is disposed in the gate layer, the first electrode and the second electrode of the first thin-film transistor are disposed in the source-drain layer; and the first electrode of the first thin-film transistor comprises a first overlap portion overlapped with the gate of the first thin-film transistor, the first overlap portion and the gate of the first thin-film transistor forming the first capacitor, the first electrode of the first thin-film transistor is connected to the active layer of the first thin-film transistor via a first via hole, and the second electrode of the first thin-film transistor is connected to the active layer of the first thin-film transistor via a second via hole, the first via hole and the second via hole passing through the interlayer insulating layer and the gate insulating layer.

11. The array substrate according to claim 10, wherein the second electrode of the first thin-film transistor comprises a second overlap portion overlapped with the gate of the first thin-film transistor, the second overlap portion and the gate of the first thin-film transistor forming a second capacitor.

12. A display device, comprising an array substrate comprising: a first conductive wire, a second conductive wire and a first electrostatic protection unit, wherein the first electrostatic protection unit comprises a first thin-film transistor and a first capacitor; wherein a gate of the first thin-film transistor is suspended and is connected to a first electrode of the first thin-film transistor via the first capacitor, the first electrode of the thin-film transistor is connected to the first conductive wire, and a second electrode of the first thin-film transistor is connected to the second conductive wire; and the array substrate further comprises: a third conductive wire, a fourth conductive wire and a second electrostatic protection unit, wherein the second electrostatic protection unit is connected between the third conductive wire and the fourth conductive wires, and the second electrostatic protection unit is in a same structure as the first electrostatic protection unit;

wherein the first conductive wire is the gate wire, the second conductive wire is the first electrostatic protection wire, the third conductive wire is the data wire, the fourth conductive wire is the second electrostatic protection wire, the data wire is intersected with the gate wire, an extension direction of the first electrostatic protection wire is the same as an extension direction of the data wire, and an extension direction of the second electrostatic protection wire is the same as an extension direction of the gate wire.

* * * * *